US011425817B2

(12) United States Patent
Ma et al.

(10) Patent No.: US 11,425,817 B2
(45) Date of Patent: Aug. 23, 2022

(54) SIDE CONTACT PADS FOR HIGH-SPEED MEMORY CARD

(71) Applicant: Western Digital Technologies, Inc., San Jose, CA (US)

(72) Inventors: Shineng Ma, Shanghai (CN); Xuyi Yang, Shanghai (CN); Chih-Chin Liao, Taiwan (TW); Chin-Tien Chiu, Taichung (TW); Jinxiang Huang, Shanghai (CN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 17/107,847

(22) Filed: Nov. 30, 2020

(65) Prior Publication Data
US 2021/0400811 A1  Dec. 23, 2021

(30) Foreign Application Priority Data
Jun. 23, 2020 (CN) .......................... 202010580597.7

(51) Int. Cl.
*H05K 1/14* (2006.01)
*H05K 5/02* (2006.01)
*H05K 7/00* (2006.01)
*H05K 7/14* (2006.01)
*G06K 7/00* (2006.01)
(Continued)

(52) U.S. Cl.
CPC .......... *H05K 1/117* (2013.01); *H01L 25/0657* (2013.01); *H01L 25/18* (2013.01); *H05K 1/181* (2013.01); *H01L 2225/06506* (2013.01); *H01L 2225/06517* (2013.01);
(Continued)

(58) Field of Classification Search
CPC ................... H05K 1/117; H05K 1/181; H05K 2201/10159; H05K 2201/09754; H05K 1/14; H05K 5/02; H05K 5/026; H05K 7/00; H05K 7/14; H01L 25/0657; H01L 25/18; H01L 2225/06517; H01L 2225/06562; H01L 2225/06506; G06K 7/00; G06K 7/0047; G06K 19/06; G06K 19/07732; G06K 19/07733; H01R 33/00; H01R 33/6485; H01R 33/6596
USPC ..... 361/783; 439/39, 60, 76.1, 79, 101, 188, 439/455, 607.41, 638, 946; 235/444, 485, 235/492
See application file for complete search history.

(56) References Cited

U.S. PATENT DOCUMENTS 4,675,516 A * 6/1987 Guion .................. G06K 7/0069
235/441
5,564,933 A * 10/1996 Bouchan ............ H01R 13/6485
439/946

(Continued)

*Primary Examiner* — Xiaoliang Chen
(74) *Attorney, Agent, or Firm* — Kunzler Bean & Adamson, PC (57) ABSTRACT

A memory card includes a memory card body dimensioned to house at least one integrated circuit die package. The memory card body, in certain embodiments, includes a first surface spaced apart from a second surface and a plurality of side surfaces connecting the first surface to the second surface. The memory card also includes a contact pad disposed on at least one side surface of the plurality of side surfaces. The contact pad includes a first conductive layer, a second conductive layer, and an insulating layer disposed between the first conductive layer and the second conductive layer.

18 Claims, 7 Drawing Sheets

(51) Int. Cl.
  *G06K 19/06*     (2006.01)
  *H01R 33/00*     (2006.01)
  *H05K 1/11*      (2006.01)
  *H01L 25/065*    (2006.01)
  *H01L 25/18*     (2006.01)
  *H05K 1/18*      (2006.01)

(52) U.S. Cl.
  CPC .............. *H01L 2225/06562* (2013.01); *H05K 2201/09754* (2013.01); *H05K 2201/10159* (2013.01)

(56) References Cited

U.S. PATENT DOCUMENTS

| | | | | |
|---|---|---|---|---|
| 5,750,973 | A * | 5/1998 | Kaufman | G06K 7/0021 |
| | | | | 235/441 |
| 6,854,984 | B1 * | 2/2005 | Lee | G06K 19/07733 |
| | | | | 439/607.41 |
| 7,875,529 | B2 * | 1/2011 | Forbes | H01L 24/94 |
| | | | | 438/455 |
| 9,578,778 | B2 * | 2/2017 | Hou | G06K 7/0073 |
| 2006/0289657 | A1 * | 12/2006 | Rosenberg | G06K 19/07345 |
| | | | | 235/492 |
| 2013/0115821 | A1 * | 5/2013 | Golko | H01R 13/6683 |
| | | | | 439/638 |
| 2013/0273752 | A1 * | 10/2013 | Rudisill | H01R 11/30 |
| | | | | 439/39 |
| 2018/0267810 | A1 * | 9/2018 | Madpur | G06F 1/04 |
| 2018/0315735 | A1 * | 11/2018 | Delacruz | H01L 25/0655 |

\* cited by examiner

SIDE CONTACT PADS FOR HIGH-SPEED MEMORY CARD

CROSS-REFERENCES TO RELATED APPLICATIONS

This application claims the benefit of Chinese Patent Application Number 202010580597.7 entitled "SIDE CONTACT PADS FOR HIGH-SPEED MEMORY CARD" and filed on Jun. 23, 2020 for Shineng Ma, et al., which is incorporated herein by reference.

TECHNICAL FIELD

The present disclosure, in various embodiments, relates to storing data at an integrated circuit, and more particularly relates to integrated circuit packaging and related structures.

BACKGROUND

The term "die" in the field of integrated circuits refers to a small block of semiconducting material, on which a circuit is fabricated. Typically a die is manufactured as part of a single wafer that includes a multiple individual dies in which fabrication techniques (e.g., deposition, removal, patterning, or the like) are utilized to form components and features of each die. Each die is connected to a package that allows the packaged die or "chip" to be connected to a circuit board or other suitable device. Non-volatile memory devices, such as universal serial bus (USB) flash memory or removable storage cards implement integrated circuits and have allowed for increased portability of data and software applications. However, as the size of the packaging of the memory devices has shrunk, the space for contact pads has also shrunk.

SUMMARY

Apparatuses are presented for a memory card that includes a memory card body dimensioned to house at least one integrated circuit die package. The memory card body, in certain embodiments, includes a first surface spaced apart from a second surface and a plurality of side surfaces connecting the first surface to the second surface. The memory card also includes a contact pad disposed on at least one side surface of the plurality of side surfaces. The contact pad includes a first conductive layer, a second conductive layer, and an insulating layer disposed between the first conductive layer and the second conductive layer Systems are presented for a memory card body having a first surface spaced apart from a second surface and a plurality of side surfaces connecting the first surface to the second surface. The system also includes an integrated circuit die package disposed within the memory card body. The integrated circuit die package includes a plurality of contact pads disposed on at least one side surface of the plurality of side surfaces, and where the contact pad comprises alternating layers of a conductive material and an insulating material. The integrated circuit die package also includes a memory stack comprising a plurality of integrated circuit dies, and a controller configured to transmit data to and receive data from the plurality of integrated circuit dies.

Other apparatuses are presented for removable memory storage. In one embodiment, an apparatus includes means for housing at least one integrated circuit die package, where the means for housing includes a first surface spaced apart from a second surface and a plurality of side surfaces connecting the first surface to the second surface. The other apparatuses also include means for electrical communication with a computing device, where the means for electrical communication are disposed on at least one side surface of the plurality of side surfaces. The means for electrical communication also include, in certain embodiments, a first conductive layer, a second conductive layer, and an insulating layer disposed between the first conductive layer and the second conductive layer.

Methods are also presented. In one embodiment, a method includes providing a memory card body. The method also includes, in certain embodiments, providing at least one contact pad disposed on a side surface of the memory card body.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Aspects of the present disclosure may be embodied as an apparatus, system, or method. Accordingly, aspects of the present disclosure may take the form of an entirely hardware embodiment or an embodiment combining software and hardware aspects that may all generally be referred to herein as a "circuit," "module," "apparatus," or "system."

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, dies, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, dies, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, dies, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, dies, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, dies, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

It should be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Figure 1:
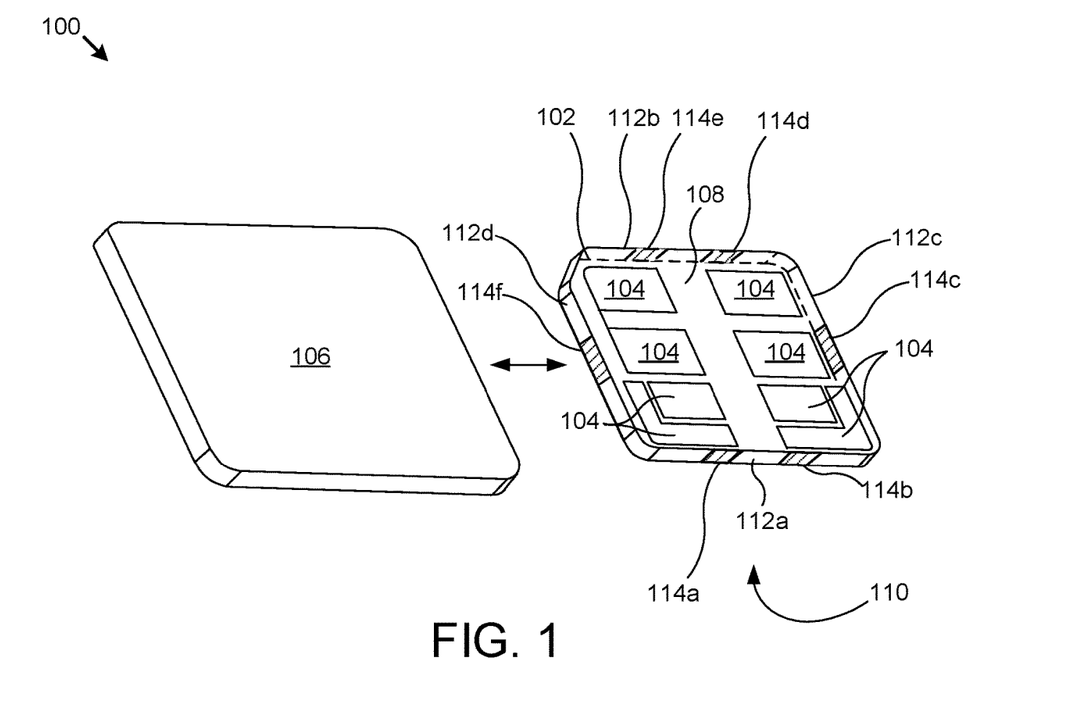
FIG. 1 is a perspective view diagram illustrating a memory card (e.g., data storage device), according to embodiments of the subject disclosure.

FIG. 1 is a perspective view diagram illustrating a memory card 100 (e.g., data storage device), according to embodiments of the subject disclosure. As will be discussed in greater detail below, the memory card 100 includes a memory card body ("body") 102 that has disposed within an integrated circuit die (ICD) substrate. The ICD substrate is configured to support a plurality of stacked integrated circuit dies. An integrated circuit die as used herein, comprises one or more fabricated electrical circuits and/or other electrical components (e.g., a monolithic integrated circuit or the like). For example, an integrated circuit die may comprise a semiconductor device (e.g., silicon, gallium arsenide, or the like) with one or more gates, transistors, capacitors, resistors, diodes, power supplies, amplifiers, traces, vias, other electrical connections, electrical contacts, and/or other integrated electrical components. The integrated circuit die may be fabricated using a photolithographic and/or chemical process in which one or more layers of semiconductors, metals or other conductors, insulators, or the like are deposited on and/or removed from a semiconductor substrate to form electrical circuits.

Multiple chips, die planes, dies and/or other integrated circuit dies, in one embodiment, may be stacked or otherwise combined in a multi integrated circuit die arrangement. For example, multiple integrated circuit dies may be stacked and laterally offset (see FIGS. 3 and 4) relative to adjacent integrated circuit dies, to provide room for electrical connections. In some embodiments, multiple integrated circuit dies may be coupled, either directly or indirectly, to the same ICD substrate or chip carrier and may communicate with each other through the ICD substrate and/or chip carrier. Multiple integrated circuit dies may be disposed within the same body 102 (e.g., for protection, mechanical support, or the like), which may be formed of a resin, plastic or other polymer, ceramic, and/or other sturdy material that houses and/or encapsulates the integrated circuit dies. To communicate with the integrated circuit dies, one or more electrical traces, pins, or contact pads 104 extend from the integrated circuit dies through the body 102 to external surfaces of the body 102 to support electrical communications out of the body 102.

Although the depicted memory card 100 is an example of a nano secure digital (SD) card, however, it is to be understood that the embodiments described and illustrated here are applicable to other memory cards 100. Examples of other memory cards 100 include, but are not limited to, Secure Digital SD® cards, miniSD™ cards (trademarks of SD-3C LLC, Wilmington, Del.) MultiMediaCard™ cards (trademark of JEDEC Solid State Technology Association, Arlington, Va.), eMMC® cards (trademark of JEDEC Solid State Technology Association, Arlington, Va.), SD Express, combination SD and SIM card for phones, or the like.

The body 102 is dimensioned for insertion into a memory card reader 106. The card reader 106 is operatively coupled to a host computing device (see FIG. 6). Examples of a card reader 106 include, but are not limited to, memory card enclosures that slidingly accept the memory card 100, trays into which the memory card 100 is inserted, or the like. As known, card readers 106 include electrical contacts for interfacing with the contact pads 104 to facilitate data transfer (e.g., reads and writes) between the host computing device and the memory card 100.

In certain embodiments, the body 102 includes a first surface (e.g., top surface 108 spaced apart form a second surface (e.g., bottom surface 110). One or more side surfaces (collective referred to as side surfaces 112, and individually as first side surface 112a, second side surface 112b, . . . , $n^{th}$ side surface 112n) couple the top surface 108 to the bottom surface 110 and enclose the area between the top surface 108 and the bottom surface 110. Typically, memory storage cards include contact pads 104 disposed on either the top surface 108 or the bottom surface 110. Initially the memory cards had sufficient surface area upon which to support two or more contact pads 104. However, over time, in general the memory cards have shrunk in size and reduced the area upon which contact pads 104 are disposed. Additionally, as read/write speeds increase, the need for additional high-speed contact pads also increases. Beneficially, the embodiments of the subject disclosure provide for contact pads 114 disposed on side surfaces 112 of the body 102.

In certain embodiments, one or more side contact pads 114 (collectively referred to as side contact pads 114, and individually as first side contact pad 114a, second side contact pad 114b, or the like) are positionable on a side surface 112 (see e.g., first side surface 112a or second side surface 112b). The side contact pads are configured to electrically couple the memory card 100 with a memory card reader 106. In some embodiments, a single side contact pad 114 is positioned on a side surface 112 (see e.g., third side surface 112c or fourth side surface 112d). In certain embodiments, transmit/receive (TX/RX) pairs of side contact pads 114a, 114b are positioned on the same side surface (see e.g., side surface 112a). In some embodiments, TX/RX pairs of side contact pads 114 are disposed opposite each other. For example, a transmit side contact pad 114a is positioned opposite its receive side contact pad 114e. Beneficially, side contact pads 114 enable high speed communication because of the additional contact pads that are available for use. A fifth side contact pad 114c and a sixth side contact pad 114f are also disclosed.

Figure 2:
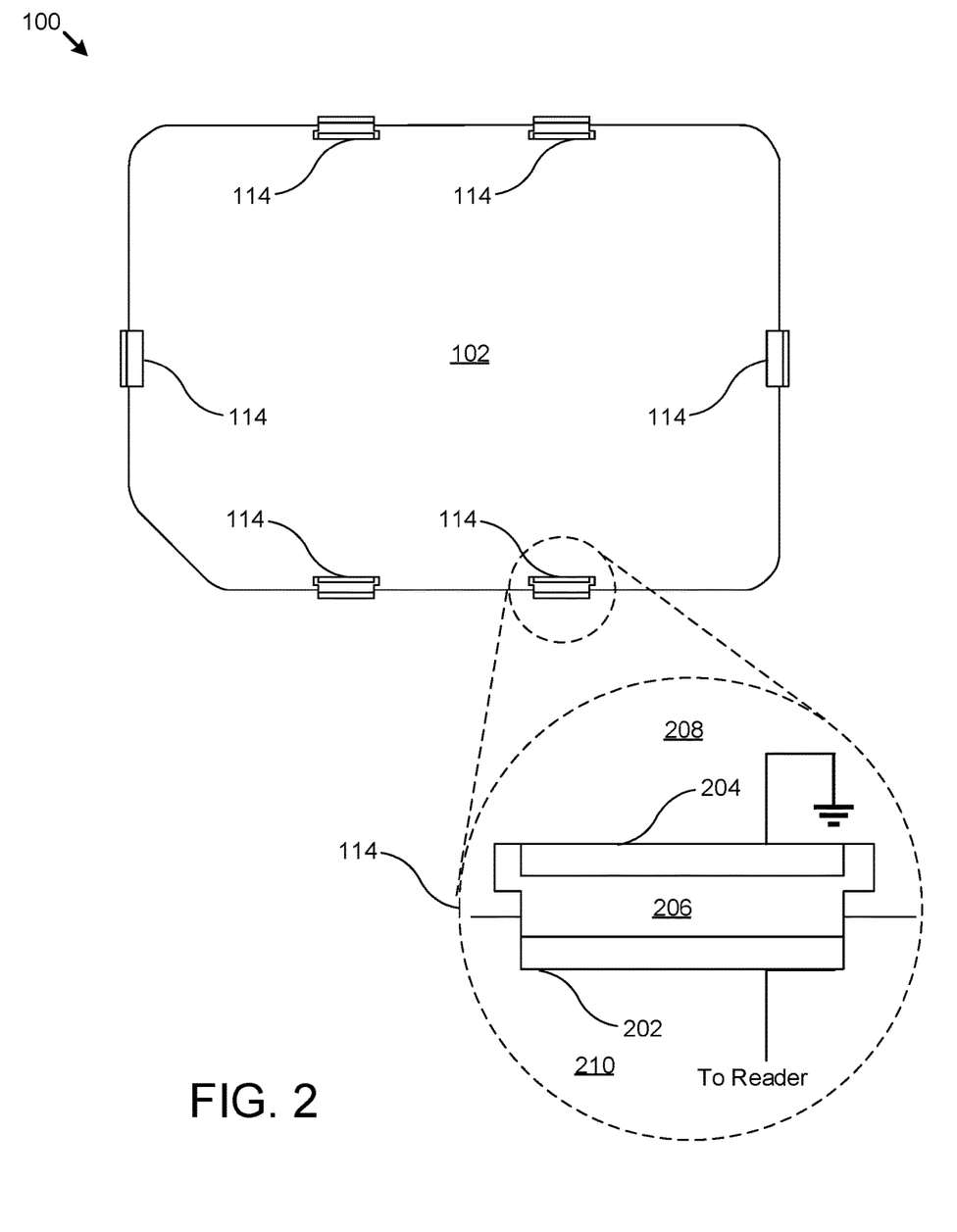
FIG. 2 is a schematic block diagram illustrating a cross-section view of the memory card, according to embodiments of the subject disclosure.

FIG. 2 is a schematic block diagram illustrating a cross-section view of the memory card 100, according to embodiments of the subject disclosure. The memory card 100, as described above, is formed with one or more side contact pads 114 extending outward from side surfaces 112 of the body 102. In certain embodiments, each side contact pad 114 includes a first conductive layer 202, a second conductive layer 204, and an insulating layer 206 (configured to insulate the first conductive layer 202 from the second conductive layer 204), or dielectric layer, disposed between the first conductive layer 202 and the second conductive layer 204.

In certain embodiments, the first conductive layer 202 is outward facing and accessible from the exterior of the body 102. Stated differently, the side contact pad 114 extends from an interior area 208 of the body 102 to an area 210 that is exterior to the body 102. The first conductive layer 202 and the second conductive layer 204, in some embodiments, are formed of a copper layer disposed on the non-conductive insulating layer 206. It is contemplated that any conductive material may be implemented as either the first conductive layer 202 or the second conductive layer 204.

The second conductive layer 204, in certain embodiments, is electrically coupled to a ground or ground plane. The second conductive layer beneficially, improves impedance control by allowing for a return path for neighboring signals. The second conductive layer 204 also solves EMI issues because the second conductive layer 204 acts as ground shielding, resolves the antenna effect of side contact pads with single layers, and enables high-speed data communications.

In certain embodiments, the insulating layer 206 may surround the second conductive layer 204 on three sides, as depicted. In other embodiments, the insulating layer 206 contacts a single side, or a portion of a single side, of the second conductive layer 204. Similarly, the insulating layer 206 may surround the first conductive layer on three sides.

Figure 3:
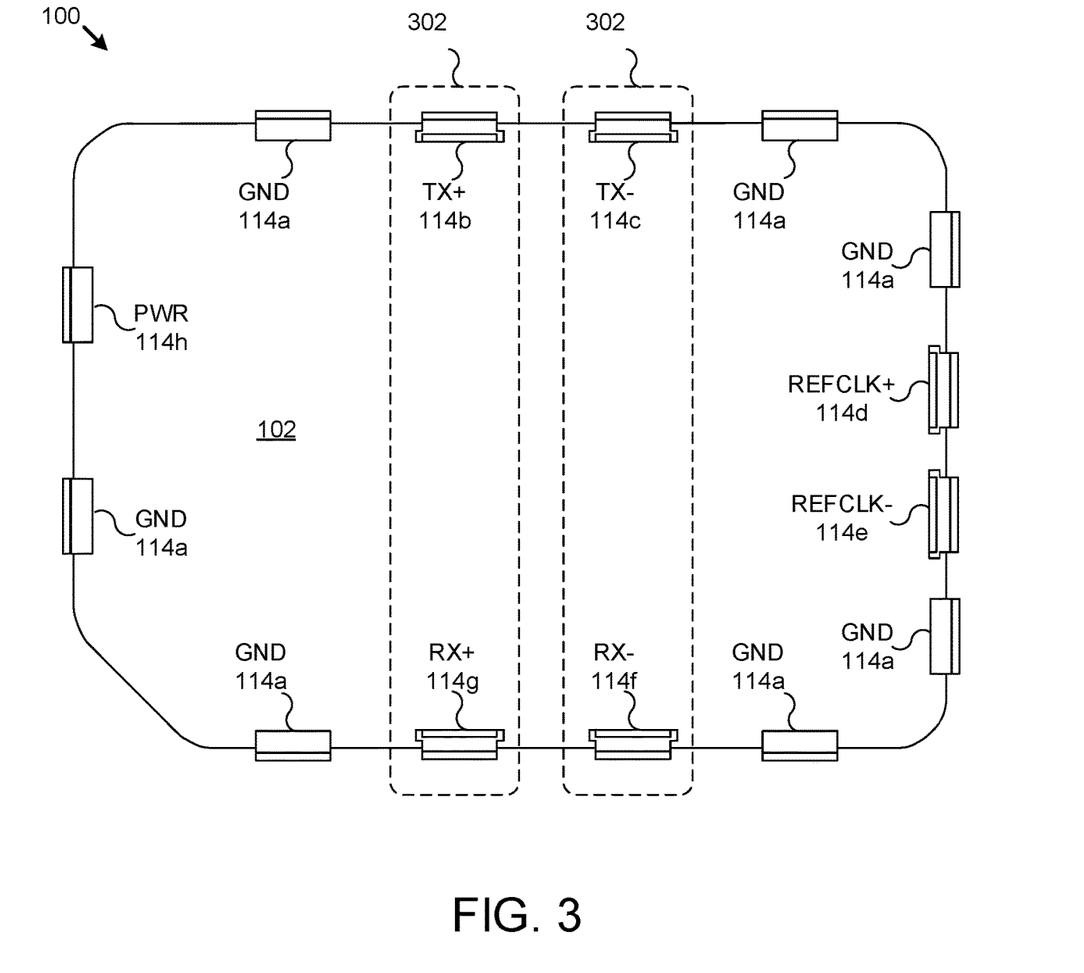
FIG. 3 is a schematic block diagram illustrating a cross-section view of the memory card, according to embodiments of the subject disclosure.

FIG. 3 is a schematic block diagram illustrating a cross-section view of the memory card 100, according to embodiments of the subject disclosure. In the depicted embodiment, the memory card 100 includes multiple side contact pads 114, each of which at least has an insulating layer and a conductive layer that is electrically coupled with a ground plane (see FIG. 2). In certain embodiments, the side contact pads 114 or pins are electrically coupled with a high-speed memory controller disposed within the body 102 that controls access to the integrated circuit dies (e.g., memory modules, memory packages, or the like) that are described in greater detail below with reference to FIG. 4.

In certain embodiments, side contact pad 114a is a ground (GND) pin. The body 102 may include multiple side contact pads 114a on each side of the body 102. High-speed data pins may be assigned to side contact pads 114b, 114c, 114g, and 114f. In some embodiments, a transmit/receive (TX/RX) pair 302 includes a TX side contact pad 114b and an RX side contact pad 114g that are disposed opposite each other, as depicted in FIG. 3. In some embodiments, the TX/RX pair 302 includes side contact pads that are not disposed opposite each other. In some embodiments, a "data transmission lane" is formed by two TX/RX pairs 302 (e.g., a differential pair, or the like). The depicted embodiment, therefore, illustrates a single data transmission lane, however, it is contemplated that any reasonable number of side contact pads 114 may be implemented to form any reasonable number of TX/RX pairs 302 (e.g., multiple differential pairs, multiple lanes, or the like), and subsequently, any reasonable number of data transmission lanes. Other side contact pads may be assigned power (PWR) 114*h*, clock (REFCLK) 114*d*, 114*e*, or the like.

Figure 4:
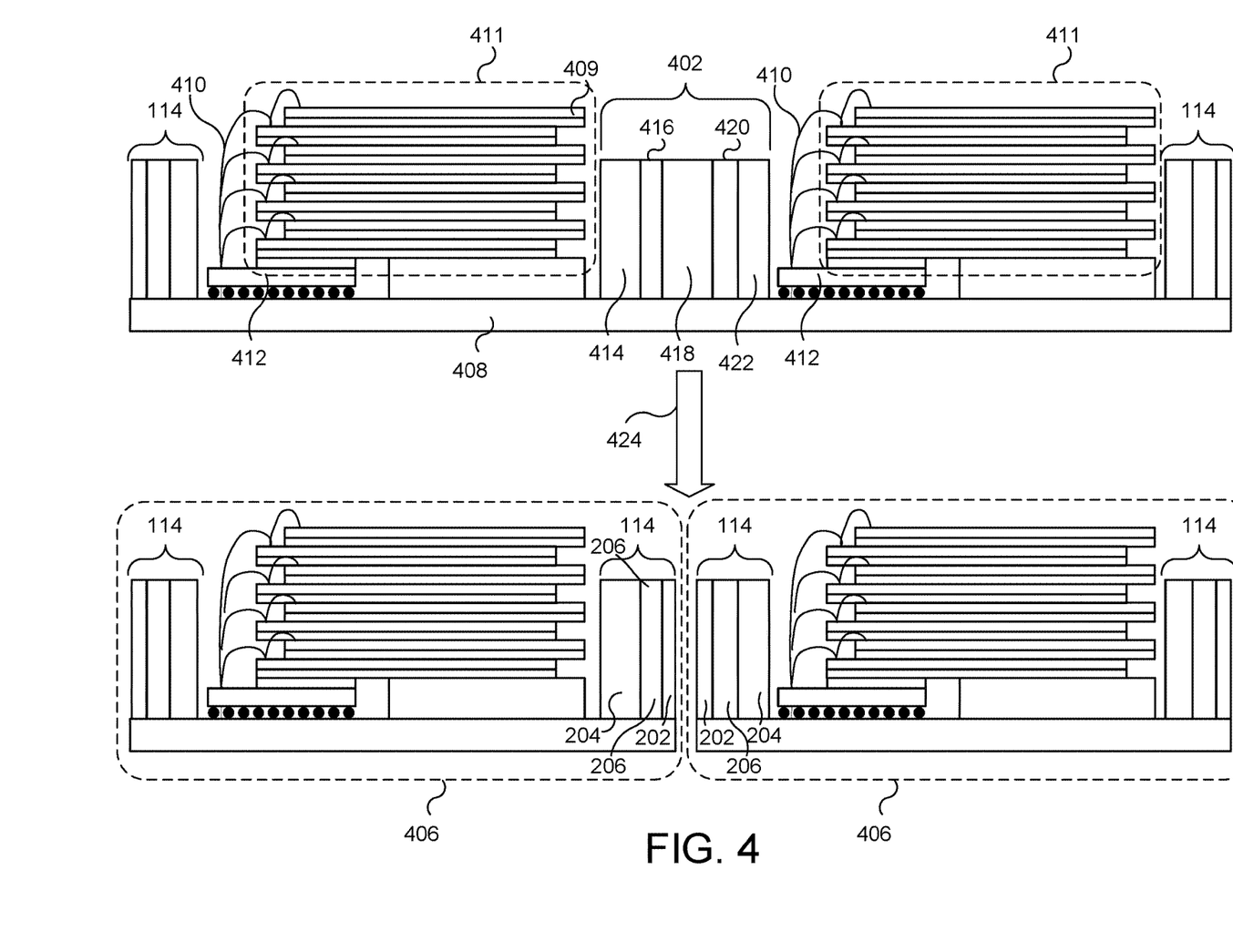
FIG. 4 is a schematic block diagram illustrating a cross-sectional, partial view of a manufacturing process for creating an integrated circuit die package having side contact pads, according to embodiments of the subject disclosure.

FIG. 4 is a schematic block diagram illustrating a cross-sectional, partial view of a manufacturing process for creating an integrated circuit die package having side contact pads, according to embodiments of the subject disclosure. In general, integrated circuit dies are produced in large batches on a single wafer of a substrate material, such as electronic-grade silicon. In certain embodiments, the side contact pads 114 may be formed during this manufacturing process forming a multi-layer block 402 between adjacent memory stacks 404, and then sliced through the multi-layer block 402 to form the side contact pad 114. Once cut, the newly separated integrated circuit die packages 406 may be placed within the body 102 of the memory card 100.

As discussed above, the body 102 of the memory card 100 may be configured to house one or more memory stacks made of integrated circuit dies 409. For clarity, only a single integrated circuit die 409 is identified in FIG. 4, but it is to be understood that each offset layer in a memory stack 411 may be an individual integrated circuit die 409. Each of the integrated circuit dies 409, in certain embodiments, is electrically connected to the ICD substrate 408 by, for example, a bonding wire 410 which is electrically coupled to a controller 412, via an electrical contact (e.g., solder ball, pin, port, trace, pillar, or the like). Although depicted as a single controller 412, in the example of a combination memory card/SIM card, the controller 412 may include a SIM controller and a memory controller. In some embodiments, the electrical contacts may be electrically and/or mechanically coupled using solder, conductive wires, ports, clamps, clips, or the like.

In certain embodiments, the ICD substrate 408 may provide electrical connections (e.g., metallic electrical traces, metalized through-silicon-vias, conductive layers, and/or other conductive pathways) between the top and bottom contact pads 104 and the side contact pads 114. For example, electrical traces, through-silicon-vias, or the like may comprise a redistribution layer making electrical signals from one or more electrical contacts. One or more integrated circuit dies 409 may comprise electrical interconnects, such as the depicted bonding wire 410 interconnects, between different integrated circuit dies 409, so that one integrated circuit die 409 may send data to one or more other integrated circuit dies 409 independently of and/or in addition to communicating through the ICD substrate 408.

The multi-layer block 402, in certain embodiments, is disposed on the ICD substrate 408 between adjacent memory stacks 411. The multi-layer block is formed of alternating layers of a conductive material and an insulating material. In the depicted embodiment, the multi-layer block 402 includes a first conductive layer 414, a first insulating layer 416, a second conductive layer 418, a second insulating layer 420, and a third conducting layer 422. In certain embodiments, during the manufacturing process (identified by arrow 424), the integrated circuit die packages 406 are separated turning the multi-layer block into side contact pads 114 having a first conductive layer 202, a second conductive layer 204, and an insulating layer 206. In other embodiments, the side contact pads 114 may be formed separately.

The integrated circuit die packages 406 may include an encapsulation material for protecting the above described components with reference to FIG. 4. The encapsulation material may comprise a resin, plastic or other polymer, ceramic, and/or other sturdy material that houses and/or encapsulates the integrated circuit dies 409, with one or more electrical traces, pins, contacts, or the like extending from the integrated circuit dies 409 (e.g., through the integrated circuit dies 409 and/or the ICD substrate 408) through the integrated circuit die packages 406 or other housing for external electrical communications out of the package.

Multiple chips, die planes, dies and/or other integrated circuit dies 409, in one embodiment, may be stacked or otherwise combined in a multi integrated circuit die 409 arrangement within the encapsulation material. For example, multiple integrated circuit dies 409 may be stacked and laterally offset relative to each other, to provide room for electrical connections. In some embodiments, multiple integrated circuit dies 409 may be coupled, either directly or indirectly, to the same ICD substrate 408 or chip carrier, and may communicate with each other through the ICD substrate 408 and/or controller 412. Multiple integrated circuit dies 409 may be disposed within the same integrated circuit die package 406 and/or housing (e.g., for protection, mechanical support, or the like), such as a resin, plastic or other polymer, ceramic, and/or other sturdy material that houses and/or encapsulates the integrated circuit dies 409, with one or more electrical traces, pins, contacts, or the like extending from the integrated circuit dies 409 through the package.

Figure 5:
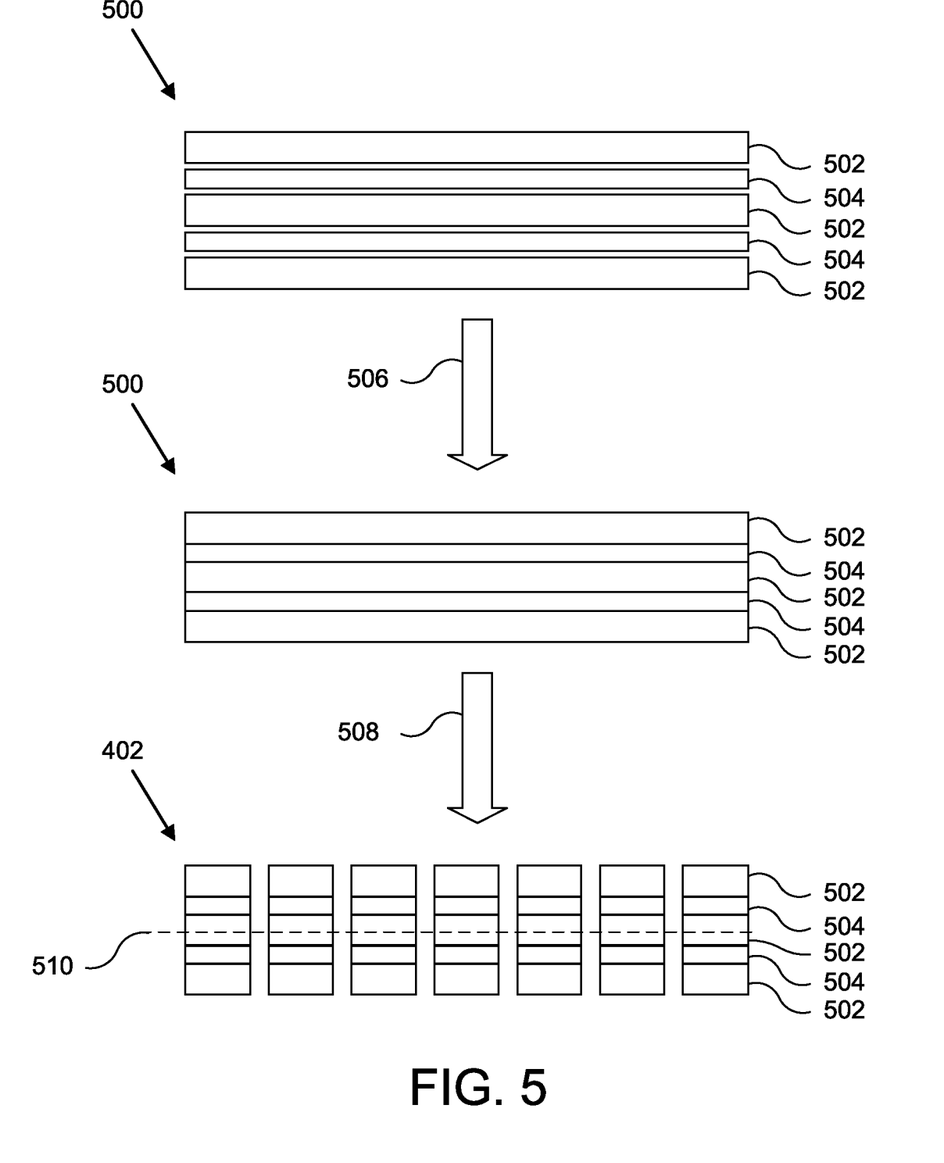
FIG. 5 is a schematic block diagram illustrating processing steps of a multi-layer block, according to embodiments of the subject disclosure.

FIG. 5 is a schematic block diagram illustrating processing steps of a multi-layer block 500, according to embodiments of the subject disclosure. The multi-layer block 402, in certain embodiments may be formed by proving five layers of alternating conductive materials 502 and insulating materials 504. Arrow 506 graphically depicts the processing step of joining together the alternating layers of conductive materials 502 and insulating materials 504. One example of a suitable process for joining together the layers includes, but is not limited to, lamination.

Arrow 508 graphically depicts the processing step of splicing or cutting the multi-layer block into multiple smaller multi-layer blocks that may be positioned on the ICD substrate 408 and then later cut or spliced into side contact pads 114, as described above with reference to FIG. 4. Dashed line 510 depicts this step that splices the smaller multi-layer blocks into side contact pads 114.

Figure 6:
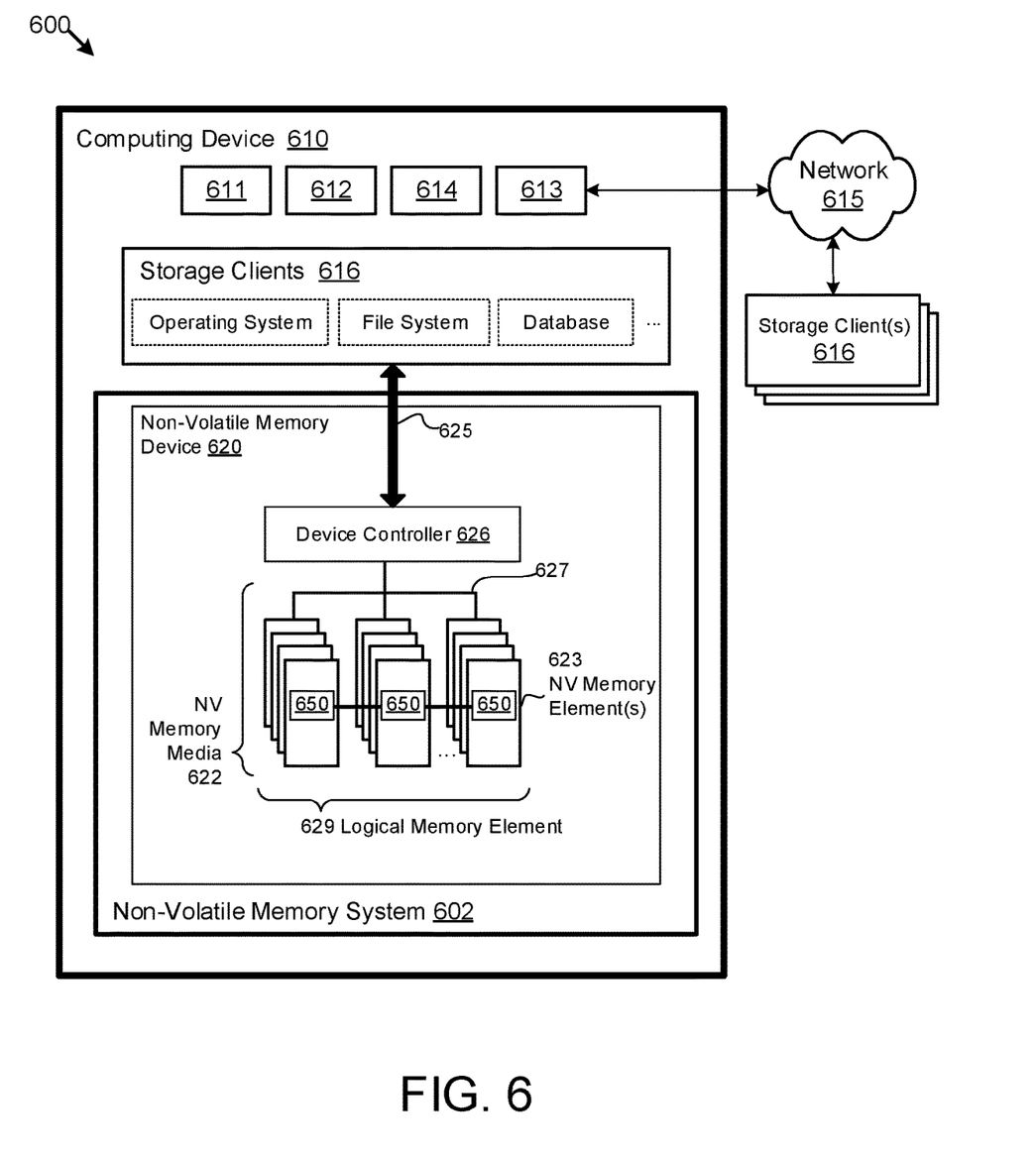
FIG. 6 is a schematic block diagram of one embodiment of a computing system for implementing the above described memory card 100 with side contact pads, according to embodiments of the subject disclosure.

FIG. 6 is a schematic block diagram of one embodiment of a computing system 600 for implementing the above described memory card 100 with side contact pads 114, according to embodiments of the subject disclosure. While a memory device 602 of a computing system 600 is used herein as one example of a system for a memory card 100, in other embodiments, the plurality of integrated circuit dies 409 may comprise one or more network interface controller (NIC) integrated circuit dies 409, one or more graphical processing unit (GPU) integrated circuit dies 409, one or more central processing unit (CPU) integrated circuit dies 409, and/or one or more other types of integrated circuit dies 409 that transmit and/or receive data.

In some embodiments, a memory device 602 of a computing device 610 may comprise a processor 611, volatile memory 612, and a communication interface 613. The processor 611 may comprise one or more central processing units, one or more general-purpose processors, one or more application-specific processors, one or more virtual processors (e.g., the computing device 610 may be a virtual machine operating within a host), one or more processor cores, or the like. The communication interface 613 may comprise one or more network interfaces configured to communicatively couple the computing device 610 and/or device 626 to a communication network 615, such as an Internet Protocol (IP) network, a Storage Area Network (SAN), wireless network, wired network, or the like.

The memory device 620, in various embodiments, may be disposed in one or more different locations relative to the computing device 610. In one embodiment, the memory device 620 comprises one or more volatile and/or non-volatile memory elements 623 (e.g., the stacked integrated circuit dies 409), such as semiconductor chips, dies, packages, or other integrated circuit devices disposed on one or more printed circuit boards, storage housings, and/or other mechanical and/or electrical support structures. For example, the memory device 620 may comprise one or more direct inline memory module (DIMM) cards, one or more expansion cards and/or daughter cards, a memory card, a universal serial bus (USB) drive, a solid-state-drive (SSD) or other hard drive device, and/or may have another memory and/or storage form factor. The memory device 620 may be integrated with and/or mounted on a motherboard of the computing device 610, installed in a port and/or slot of the computing device 610, installed on a different computing device 610 and/or a dedicated storage appliance on the network 615, in communication with the computing device 610 over an external bus (e.g., an external hard drive), or the like.

The memory device 620, in one embodiment, may be disposed on a memory bus of a processor 611 (e.g., on the same memory bus as the volatile memory 612, on a different memory bus from the volatile memory 612, in place of the volatile memory 612, or the like). In a further embodiment, the memory device 620 may be disposed on a peripheral bus of the computing device 610, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 620 may be disposed on a data network 615, such as an Ethernet network, an Infiniband network, SCSI RDMA over a network 615, a storage area network (SAN), a local area network (LAN), a wide area network (WAN) such as the Internet, another wired and/or wireless network 615, or the like.

One or more integrated circuit dies 409 may comprise electrical interconnects (e.g., one or more local buses, back channels, sub-networks, internal networks, internal buses, bond wires, circuit traces, or the like) between the integrated circuit dies 409, so that one (e.g., an active integrated circuit) may send data to one or more other integrated circuit dies 409, and the integrated circuit dies 409 may transmit the data in parallel (e.g., to a device controller 626, to a processor 611, to a computer readable storage medium 614, over a data network 615, over a bus 625, or the like).

According to various embodiments, a device controller 626 may manage one or more memory devices 620, memory elements (e.g., integrated circuit dies 409), and/or other integrated circuit devices. The memory device(s) 620 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 620). Memory units may include, but are not limited to pages, memory divisions, blocks, sectors, collections or sets of physical storage locations (e.g., logical pages, logical blocks), or the like.

The communication interface 613 may comprise one or more network interfaces configured to communicatively couple the computing device 610 and/or the device controller 626 to a network 615 and/or to one or more remote, network-accessible storage clients 616. The storage clients 616 may include local storage clients 616 operating on the computing device 610 and/or remote, storage clients 616 accessible via the network 615 and/or the communication interface 613. The device controller 626 is part of and/or in communication with one or more memory devices 620. Although FIG. 6 depicts a single memory device 620, the disclosure is not limited in this regard and could be adapted to incorporate any number of memory devices 620.

The memory device 620 may comprise one or more integrated circuit dies 409 of volatile and/or non-volatile memory media 622, which may include but is not limited to: volatile memory such as SRAM and/or DRAM; non-volatile memory such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), and/or optical storage media; or other memory and/or storage media. The one or more integrated circuit dies 409 of memory media 622, in certain embodiments, comprise storage class memory (SCM).

While the memory media 622 is referred to herein as "memory media," in various embodiments, the memory media 622 may more generally comprise one or more volatile and/or non-volatile recording media capable of recording data, which may be referred to as a memory medium, a storage medium, or the like. Further, the memory device 620, in various embodiments, may comprise a recording device, a memory device, a storage device, or the like. Similarly, a memory element 623, in various embodiments, may comprise a recording element, a memory element, a storage element, or the like. In other embodiments, a memory element 623 may comprise a different type of integrated circuit device (e.g., an ASIC, a CPU, a communications device, a graphics device, a system on a chip, a programmable logic device, or the like), and memory elements 623 are used only by way of example as one type of integrated circuit device (e.g., integrated circuit die, chip, die plane, package, or the like), and other types of integrated circuit devices are contemplated within the scope of this disclosure.

The memory media 622 may comprise one or more memory elements 623, which may include, but are not limited to: chips, packages, dies, die planes, or the like. A device controller 626 may be configured to manage data operations on the memory media 622, and may comprise one or more processors, programmable processors (e.g., FPGAs), ASICs, micro-controllers, or the like. In some embodiments, the device controller 626 is configured to store data on and/or read data from the memory media 622, to transfer data to/from the memory device 620, and so on. In certain embodiments, the memory media 622 is the memory card 100, which communicates with the computing device 610 via a card reader 106 (see FIG. 1) that is coupled to the computing device 610.

The device controller 626 may be communicatively coupled to the memory media 622 and/or other integrated circuit dies 409 by way of a bus 627. The bus 625 may comprise an I/O bus for communicating data to/from the integrated circuit dies 409. The bus 627 may further comprise a control bus for communicating addressing and other command and control information to the integrated circuit dies 409. In some embodiments, the bus 627 may communicatively couple the integrated circuit dies 409 to the device controller 626 in parallel. This parallel access may allow the integrated circuit to be managed as a group (e.g., in an embodiment where the integrated circuit dies 409 comprise memory elements, forming a logical memory element 629, or the like). A logical memory element 629 may be partitioned into respective logical memory units (e.g., logical pages) and/or logical memory divisions (e.g., logical blocks). The logical memory units may be formed by logically combining physical memory units of each of the integrated circuit dies 409.

Figure 7:
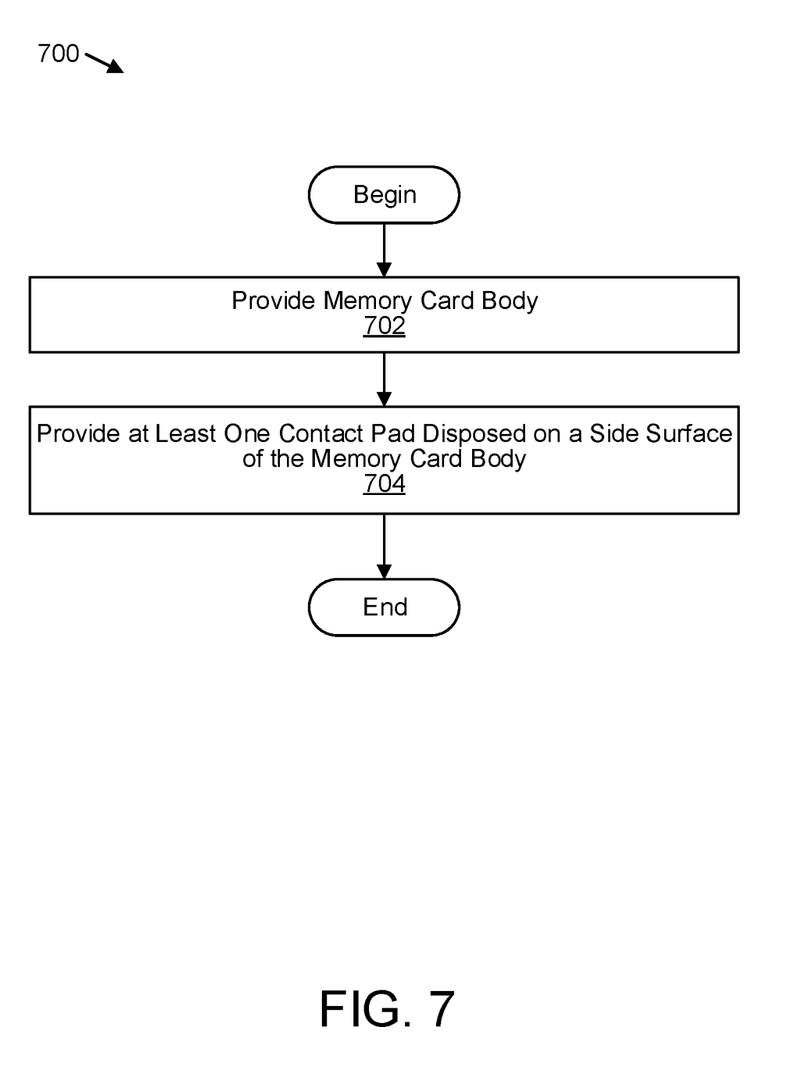
FIG. 7 is a flow chart illustrating one embodiment of a method for forming a data storage device, according to embodiments of the subject disclosure.

FIG. 7 is a flow chart illustrating one embodiment of a method 700 for forming a data storage device, according to embodiments of the subject disclosure. A manufacturer (e.g., an assembly house), as used herein, comprises a factory that takes wafers having a plurality of integrated circuit dies and packaging the dies into integrated circuit devices, such as solid-state memory devices.

The method 700 begins and a manufacturer provides 702 a memory card body 102. The memory card body may have a top surface and a bottom surface spaced apart from the top surface. Side surfaces 112 couple the top surface 108 to the bottom surface 110, and together form an area within the body 102 to house an integrated circuit device package.

The method 700 also includes providing 704 at least one side contact pad 114 disposed on a side surface of the memory card body 102. In certain embodiments, the manufacturer creates a substrate with a plurality of memory stacks 404 having a plurality of multi-layer blocks 402 disposed between the memory stacks 404. The manufacturer then cuts or splices the substrate to form individual integrated circuit device packages. In certain embodiments, the manufacturer cuts through the multi-layer blocks 402 to form the side contact pads 114.

A means for housing at least one integrated circuit die package, in various embodiments, may include a memory card body having top, bottom, and side surfaces, or the like. The body may be formed of two halves that are joined together to form the body. Other embodiments may include similar or equivalent means for housing at least one integrated circuit die package.

A means for electrical communication with a computing device, in various embodiments, may include contact pads formed on side surfaces of a means for housing, or the like. The contact pads may include a first conductive layer, a second conductive layer, and an insulating layer disposed between the first conductive layer and the second conductive layer. Other embodiments may include similar or equivalent means for communicating through a side surface of the means for housing, including pins, traces, contacts, or the like.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus, comprising:
   a memory card body dimensioned to house at least one integrated circuit die package, the memory card body comprising a first surface spaced apart from a second surface and a plurality of side surfaces connecting the first surface to the second surface; and
   a contact pad disposed on at least one side surface of the plurality of side surfaces, the contact pad comprising:
      a first conductive layer, wherein the first conductive layer is disposed on an external surface of the at least one side surface of the memory card body and configured to electrically couple to a memory card reader;
      a second conductive layer that is disposed within the memory card body and is electrically coupled to a ground, and wherein the second conductive layer is not electrically coupled with the first conductive layer; and
      an insulating layer disposed between the first conductive layer and the second conductive layer.

2. The apparatus of claim 1, wherein the contact pad comprises a first contact pad and the at least one side surface of the plurality of side surfaces comprises a first side surface, the apparatus further comprising a second contact pad disposed on the first side surface.

3. The apparatus of claim 2, further comprising:
   a third contact pad disposed on a second side surface that is positioned opposite the first side surface; and
   a fourth contact pad disposed on the second side surface.

4. The apparatus of claim 3, wherein the third contact pad is configured to transmit data to a memory card reader.

5. The apparatus of claim 3, wherein the fourth contact pad is configured to receive data from a memory card reader.

6. The apparatus of claim 3, further comprising a fifth contact pad disposed on a third side surface.

7. The apparatus of claim 6, further comprising a sixth contact pad disposed on a fourth side surface that is positioned opposite the third side surface.

8. A system, comprising:
   a memory card body comprising a first surface spaced apart from a second surface and a plurality of side surfaces connecting the first surface to the second surface; and
   an integrated circuit die package disposed within the memory card body, the integrated circuit die package comprising:
      a plurality of contact pads disposed on at least one side surface of the plurality of side surfaces, the contact pad comprising alternating layers of a conductive material and an insulating material, wherein at a first layer of the alternating layers is not electrically coupled to a second conductive layer of the alternating layers, and wherein the second conductive layer is electrically coupled to a ground;
      a memory stack comprising a plurality of integrated circuit dies; and
      a controller configured to transmit data to and receive data from the plurality of integrated circuit dies.

9. The system of claim 8, wherein the first layer of the alternating layers is disposed on an external surface of the at least one side surface of the memory card body and configured to electrically couple to a memory card reader.

10. The system of claim 9, further comprising a third layer of the alternating layers, wherein the third layer is disposed within the memory card body and is configured to insulate the first layer from the second layer of the alternating layers.

11. The system of claim 10, wherein the second layer is disposed within the memory card body.

12. The system of claim 8, further comprising a first contact pad and a second contact pad of the plurality of contact pads disposed on a first side surface of the plurality of side surfaces.

13. The system of claim 12, further comprising a third contact pad and a fourth contact pad of the plurality of contact pads disposed on a second side surface of the plurality of side surfaces.

14. The system of claim 13, wherein the third contact pad is configured to transmit data to a memory card reader.

15. The system of claim 13, wherein the fourth contact pad is configured to receive data from a memory card reader.

16. The system of claim 13, further comprising a fifth contact pad of the plurality of contact pads disposed on a third side surface of the plurality of side surfaces.

17. The system of claim 16, further comprising a sixth contact pad of the plurality of contact pads disposed on a fourth side surface of the plurality of side surfaces, the fourth side surface positioned opposite the third side surface.

18. An apparatus comprising:
means for housing at least one integrated circuit die package, wherein the means for housing includes a first surface spaced apart from a second surface and a plurality of side surfaces connecting the first surface to the second surface; and
means for electrical communication with a computing device, wherein the means for electrical communication is disposed on at least one side surface of the plurality of side surfaces, the means for electrical communication comprising:
a first conductive layer, wherein the first conductive layer is disposed on an external surface of one of the plurality of side surfaces and is configured to electrically couple to a memory card reader;
a second conductive layer that is disposed within the means for housing and is electrically coupled to a ground, and wherein the second conductive layer is not electrically coupled with the first conductive layer; and
an insulating layer disposed between the first conductive layer and the second conductive layer.

* * * * *